(12) United States Patent
Matsui et al.

(10) Patent No.: US 7,282,781 B2
(45) Date of Patent: Oct. 16, 2007

(54) SEMICONDUCTOR DEVICE WITH A SHORT-LIFETIME REGION AND MANUFACTURING METHOD THEREOF

(75) Inventors: Toshiyuki Matsui, Nagano (JP); Yasuyuki Hoshi, Nagano (JP); Yasuyuki Kobayashi, Nagano (JP); Yasushi Miyasaka, Nagano (JP)

(73) Assignee: Fuji Electric Device Technology Co., Ltd. (JP)

( * ) Notice: Subject to any disclaimer, the term of this patent is extended or adjusted under 35 U.S.C. 154(b) by 144 days.

(21) Appl. No.: 11/080,367

(22) Filed: Mar. 15, 2005

(65) Prior Publication Data
US 2005/0263842 A1    Dec. 1, 2005

(30) Foreign Application Priority Data
May 27, 2004    (JP) ............... PA 2004-158223

(51) Int. Cl.
*H01L 31/0288* (2006.01)
(52) U.S. Cl. ............... 257/610; 257/612; 438/514
(58) Field of Classification Search ........... 257/453, 257/543; 438/610, 612, 514
See application file for complete search history.

(56) References Cited

U.S. PATENT DOCUMENTS 6,603,189 B2 *  8/2003  Takahashi ............... 257/617
6,707,131 B2 *  3/2004  Kitamura et al. ........ 257/610

FOREIGN PATENT DOCUMENTS

| JP | 10-116998 A | 5/1998 |
|---|---|---|
| JP | 10-200132 A | 7/1998 |
| JP | 2001-135831 A | 5/2001 |
| JP | 2003-249662 A | 9/2003 |
| JP | 2004-6664 A | 1/2004 |

OTHER PUBLICATIONS

Tomomatsu, Y. et al., "An analysis and improvement of destruction immunity during reverse recovery for high voltage planar diodes under dirr/dt condition," IEEE, 1996, . . . (continued) ISBN: 0-7803-3106-0/96, pp. 353-356.

* cited by examiner

*Primary Examiner*—Roy Potter
(74) *Attorney, Agent, or Firm*—Rossi, Kimms & McDowell LLP (57) ABSTRACT

A semiconductor device has an $n^-$-semiconductor layer and $p^+$-diffusion regions each having a depth of 14 to 20 μm (design value) selectively formed in the $n^-$ semiconductor layer. With the entire surface of the chip irradiated with light ions, such as He ions, a lifetime killer is introduced from a position d2 shallower than a position d1 of a p-n junction surface, formed from the $n^-$-semiconductor layer and the $p^+$-diffusion regions, to a position d3 deeper than the position d1 to form a short-lifetime region over the entire chip. The irradiation is carried out so that the light ion irradiation half width is not more than the depth of the $p^+$-diffusion regions and a position of a peak of the light ions becomes deeper than the light ion irradiation half width and within the range between 80% and 120% of the depth of the $p^+$-diffusion regions. Thus, in a semiconductor device such as a converter diode, a capability for a high decay rate of a reverse recovery current di/dt can be brought sufficiently high to such an extent that the device can withstand a lightening surge with a low forward voltage VF being kept low.

18 Claims, 7 Drawing Sheets

SEMICONDUCTOR DEVICE WITH A SHORT-LIFETIME REGION AND MANUFACTURING METHOD THEREOF

BACKGROUND

Figure 6:
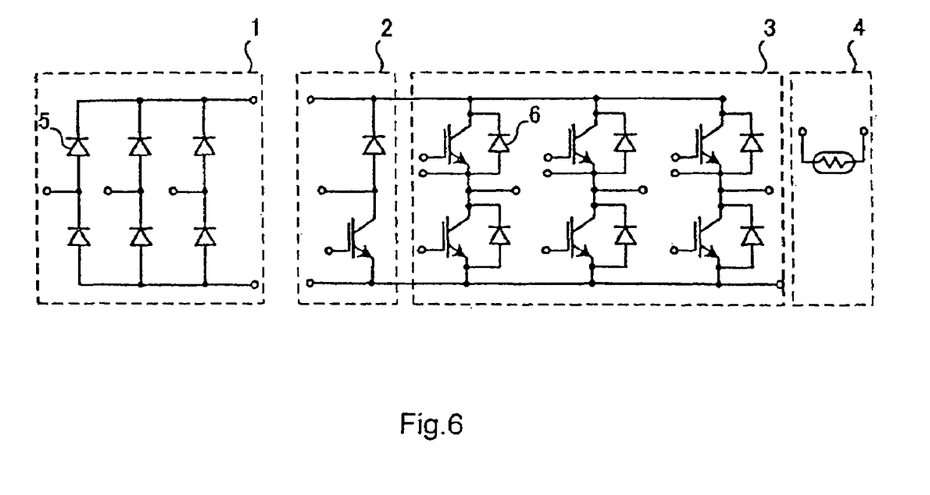
FIG. 6 is a circuit diagram showing an example of an automobile power module.

FIG. 6 is a circuit diagram showing an example of an automobile power module. As shown in FIG. 6, the power module is provided with a converter section 1, a break section 2, an inverter section 3, and a thermistor 4. The converter section 1 has converter diodes 5 each ordinarily made of a PIN diode. For example, for a module with a rated voltage of 1200V or 600V, a PIN diode with a breakdown voltage of 1600V or above or 800V or above is used, respectively, as a converter diode 5. The reason that the breakdown voltage is above the rated voltage is because the voltage higher than the rated voltage is sometimes applied to the module. This protects the PIN diode against breakdown in such a case. Moreover, in the PIN diode used as the converter diode 5, the diode 5 needs to have a low forward voltage VF. For example, in a converter diode 5 with a module rated voltage of 1200V, a required value for the forward voltage VF is on the order of 1.2 to 1.5 V.

Figure 7:
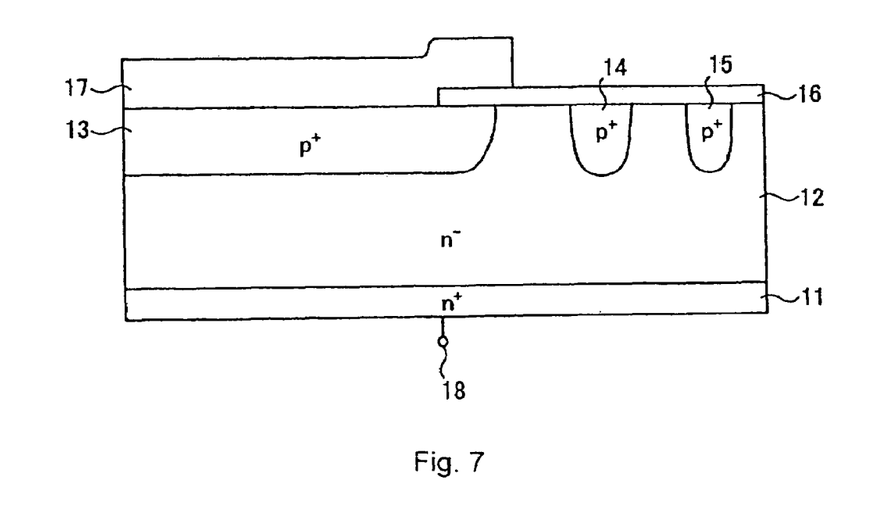
FIG. 7 is a cross sectional view showing a structure of a related planar PIN diode.

FIG. 7 is a cross sectional view showing a structure of a related planar PIN diode. As shown in FIG. 7, on an $n^+$-semiconductor layer 11, an $n^-$-semiconductor layer 12 (a cathode region) is formed. In the surface layer of the $n^-$-semiconductor layer 12, a $p^+$-diffusion region 13 (an anode region) and $p^+$-diffusion regions 14 and 15 (guard ring regions) are formed.

The surfaces of the $p^+$-diffusion regions 14 and 15 are covered with an insulator layer film 16 such as a $SiO_2$ film. An anode electrode 17 is formed on and in contact with the $p^+$-diffusion layer 13. The $n^+$-semiconductor layer 11 is electrically in contact with a cathode electrode 18. In the specification and the attached drawings, a leading character "n" or "p" attached to a name of a layer or a region means that carriers in the layer or the region are electrons or holes, respectively. Moreover, a sign "+", "−", or "−−" attached to the right and above of the leading character "n" or "p" represents that impurity concentration in the layer or the region is comparatively high, comparatively low, or lower, respectively.

Specifications such as dimensions of sections in the related converter diode 5 are as follows. In a module with a rated voltage of 1200V and a breakdown voltage of 1600V, the thickness of the $n^-$-semiconductor layer 12, made of an FZ wafer having specific resistance of about 120 Ωcm, is 300 μm. The $p^+$-diffusion layer 13 is formed to a depth of 6 to 8 μm with a dose of $1\times10^{15}$ cm$^{-2}$.

In a module with a rated voltage of 600V and a breakdown voltage of 800V, the thickness of the $n^-$-semiconductor layer 12, made of a diffusion wafer having specific resistance of about 40Ωcm, is on the order of 80 μm. Regarding the $p^+$-diffusion layer 13, the depth and the dose are the same as those of the module with the rated voltage of 1200V.

Figure 8:
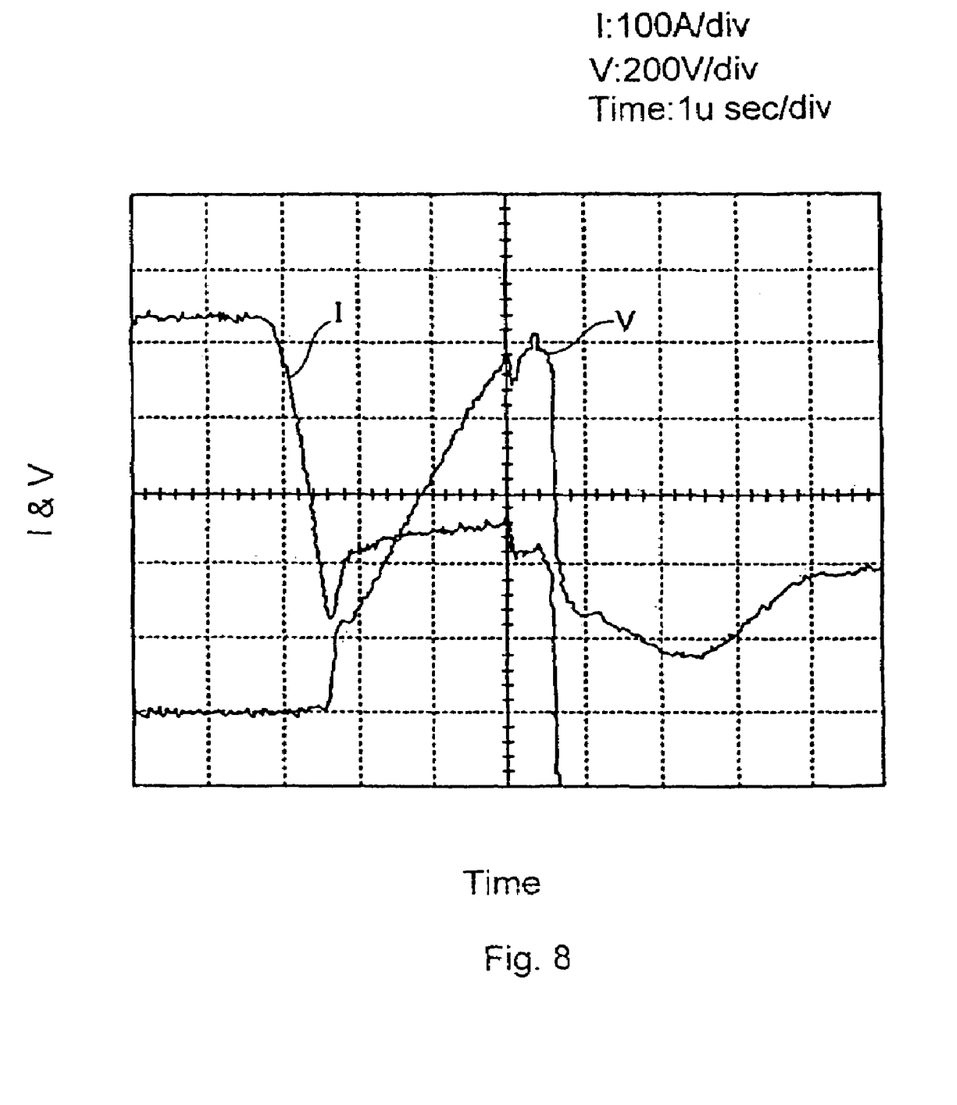
FIG. 8 is a waveform diagram showing waveforms of a current and a voltage when a surge is inputted to a related converter section.

In the above-described power module, when a lightening surge is input to the module while the converter section 1 is being operated, a surge with a high decay rate of a reverse recovery current (hereinafter expressed as a di/dt) is applied to the converter section 1. This brings the converter diode 5 into a violent reverse recovery operation mode, which sometimes can damage the converter diode 5 that cannot withstand a high di/dt as shown in FIG. 8. FIG. 8 is a waveform diagram showing waveforms of a current I and a voltage V when a surge with a high di/dt is input to a related converter section 1 to damage the converter diode 5. In the waveform diagram in FIG. 8, the vertical axis represents the current I and the voltage V, and the horizontal axis represents a time with one scale division on the axis taken as 100 A for the current I, 200V for the voltage V, and 1 μsec for the time.

In order to prevent such a problem from occurring, for a converter section 1 mounted on a power module, it has been required in recent years that the converter section 1 be able to withstand a surge with a high di/dt such as a lightening surge. In the following, the capability against such a di/dt is to be expressed as a di/dt capability.

In the reverse recovery operation mode of the diode, heat generation due to current excessively concentrated in a peripheral section of a chip results in damage of the diode. For avoiding this, there is a proposal in which a region with carriers having a short lifetime is formed only in an end section of an electrode of the diode by He ion irradiation to enhance a reverse recovery capability (see JP-A-2001-135831, for example). Forming a region with carriers having a short lifetime by He ion irradiation is described in JP-A-10-116998, for example.

Moreover, a high speed diode is known in which a lifetime killer is introduced around a p-n junction with a junction depth of 4 to 8 μm to shorten a lifetime of carriers around the p-n junction (see JP-A-10-200132, for example). In addition, a semiconductor device is known in which, to a diode having a p-n junction with a junction depth of the order of 3 μm, He ion irradiation is carried out within the range of 10 to 30 μm in depth to introduce a region with carriers having a shortened lifetime in an $n^-$-layer under a p-layer (see JP-A-2003-249662, for example). Furthermore, a method of manufacturing a semiconductor element is known in which heavy metal as a lifetime killer is introduced by thermal diffusion (see JP-A-2004-6664, for example).

Incidentally, specifications such as dimensions of sections in a freewheeling diode 6 (see FIG. 6) in the inverter section 3 are as follows. With a breakdown voltage of 1200V, in an epitaxial wafer having an $n^{--}$-semiconductor layer and an $n^-$-semiconductor layer, the thickness of the $n^{--}$-semiconductor layer, having specific resistance of about 65 Ωcm, is about 70 μm. The thickness of the $n^-$-semiconductor layer, having specific resistance of about 40 Ωcm, is about 50 μm.

With a breakdown voltage of 600V, in a similar epitaxial wafer, the thickness of an $n^{--}$-semiconductor layer, having specific resistance of about 25 Ωcm, is about 45 μm. The thickness of an $n^-$-semiconductor layer, having specific resistance of about 15 Ωcm, is about 25 μm. In both of the epitaxial wafers with the above breakdown voltages, $p^+$-diffusion layers are formed to a depth of 3 to 4 μm with a dose of the order of $1\times10^{13}$ cm$^{-2}$.

The technologies described in the above references relate to soft recovery characteristics at reverse recovery when the semiconductor devices are ordinarily operated and protection of breakdown at reverse recovery with the soft recovery characteristics. The di/dt in the ordinary recovery characteristics is on the order of 500 to 1000 A/sec.

Compared with this, the di/dt of a lightening surge supposed to be input to the converter section is about 3500 A/μsec. Therefore, the di/dt capabilities obtained by the technologies described in the above references are insufficient for the di/dt of a high surge such as a lightening surge. Experiments actually carried out by the present inventors have proved that it is impossible with the technologies described in all of the above references to obtain such a high di/dt capability as to be effective against a surge such as a lightening surge.

For example, it is known that a di/dt capability is improved to some extent by introducing a lifetime killer onto the whole surface of a diode to reduce carrier lifetime over the whole surface of a chip. This, however, necessitates a significantly increase in a forward voltage VF. In a converter diode, however, as explained above, the forward voltage VF needs to be low. Thus, it is not preferable to increase the forward voltage VF.

Moreover, a di/dt capability is also improved to some extent by locally reducing a lifetime of carriers in a peripheral section and end section of a chip. However, no di/dt capability can be obtained that is sufficiently high to such an extent that the chip can withstand a lightening surge. Furthermore, in this case, for locally introducing a lifetime killer, it is necessary to form a thick shielding film for sections into which no lifetime killer is introduced and to remove the shielding film. This therefore complicates the manufacturing process, resulting in an increase in a chip cost.

In addition, even though a region with a short lifetime of carriers is locally formed in the depth direction on the surface of the chip or in its vicinity by using He ions or protons, no sufficient di/dt capability can be obtained. Further, in the case of diffusing heavy metal as a lifetime killer, there is difficulty in controlling the diffusion depth of the heavy metal.

There remains a need to solve the problems in the above-explained related art. The present invention addresses this need

SUMMARY OF THE INVENTION

The present invention relates to a semiconductor device, particularly for the ones mounted on a module, such as a power module, and a manufacturing method thereof. More particularly, the present invention relates to a semiconductor device having a high capability against a lightning surge applied to a semiconductor module and a manufacturing method thereof.

One aspect of the present invention is a semiconductor device having a semiconductor layer of a first conductivity type, a diffusion region of a second conductivity type semiconductor region selectively provided in the surface layer of the first conductivity type semiconductor layer, and a short-lifetime region with a lifetime of carriers made shorter than lifetimes of carriers in other regions. The diffusion region can have a depth of 12.6 µm or greater. The short-lifetime region includes a lifetime killer, formed by irradiation with light ions, over the entire first conductivity type semiconductor layer and the diffusion region from a position shallower than the deepest position of a p-n junction surface, as a junction interface between the diffusion region and the first conductivity type semiconductor layer, to a position deeper than the deepest position of the p-n junction surface.

The light ions can be He ions. The depth of the diffusion region can be 14 µm or greater, and can be equal to or less than 22 µm.

The semiconductor device includes at least one guard ring region provided around an active region, which makes current flow as a semiconductor device. The diffusion region includes the guard ring region. Alternatively, the guard ring region can be considered as another diffusion region.

The semiconductor device can be a PIN diode.

Another aspect of the present invention is a method of manufacturing the semiconductor device described above. The method can include the steps of providing the semiconductor layer of the first conductivity type, selectively forming the diffusion region of the second conductivity type in the semiconductor layer so that the depth of the diffusion region becomes 14 µm or greater, and forming the short-lifetime region, with the lifetime of carriers made shorter than lifetimes of carriers in other regions. The lifetime killer can be formed by irradiating with light ions over the entire surfaces of the semiconductor layer and the diffusion region, from a position shallower than the deepest position of a p-n junction surface, as a junction interface between the diffusion region and the semiconductor layer, to a position deeper than the deepest position of the p-n junction surface.

The light ions can be He ions, which can be irradiated over the entire surfaces of the semiconductor layer and the diffusion region so that a position of a peak of the He ions becomes deeper than a half width of the He ion irradiation. The He ion irradiation can be carried out so that the position of the peak of the He ions comes within the range between 80% and 120% of the depth of the diffusion region. The He ions can be $^3He^{2+}$ as He ion species.

Another aspect of the present invention is the semiconductor made by the above method.

As the short-lifetime region is provided over the surface of the chip in the region from a position shallower than the p-n junction surface with a depth of 12.6 µm or greater to a position deeper than the p-n junction surface, a sufficiently high di/dt capability can be obtained against a surge such as a lightening surge without considerably increasing the forward voltage VF.

DETAILED DESCRIPTION

After extensive studies, the present inventors have discovered that, by presenting an area with a shortened lifetime of carriers over the whole surface of a chip in an area ranging from a position shallower than a p-n junction to a position deeper than the junction, a sufficiently high di/dt capability can be obtained against a surge, such as a lightening surge. Moreover, the present inventors also discovered that, with the p-n junction surface provided deep to some extent, a sufficiently high di/dt capability can be obtained against a surge such as a lightening surge. The invention has been made on the basis of such findings.

In the following, preferred embodiments of a semiconductor device and a method of manufacturing the device according to the invention will be explained in detail with reference to the attached drawings.

Figure 1:
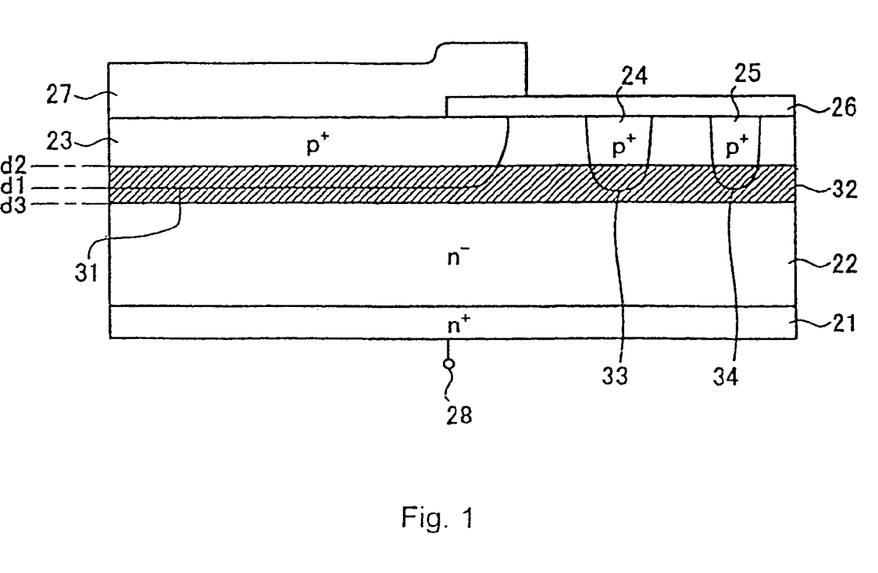
FIG. 1 is a cross sectional view showing a structure of a planar PIN diode according to an embodiment of the invention.

FIG. 1 is a cross sectional view showing a structure of a planar PIN diode according to the embodiment of the invention. As shown in FIG. 1, on an n$^+$-semiconductor layer 21, an n$^-$-semiconductor layer 22 (a cathode region) is formed. In an active region that makes current flow as a diode, a p$^+$-diffusion region 23 (an anode region) is selectively formed in the surface layer of the n$^-$-semiconductor layer 22. Moreover, in a voltage withstanding structure section on the outside of the active region, p$^+$-diffusion regions 24 and 25 (guard ring regions) are formed in the surface layer of the n$^-$-semiconductor layer 22. The surface of the voltage withstanding structure is covered with an insulator film 26 such as a SiO$_2$ film. The p$^+$-diffusion layer 23 is in contact with an anode electrode 27 formed thereon. The n$^+$-semiconductor layer 21 is electrically connected to a cathode electrode 28. Furthermore, a short-lifetime region 32 is provided over the entire chip.

The short-lifetime region 32 extends from a position d2 to a position d3, along the entire chip. The depth of the position d2 is shallower than the depth of a position d1, the deepest position of a p-n junction surface 31 as a junction interface between the n$^-$-semiconductor layer 22 and the p$^+$-diffusion region 23. The depth of the position d3 is deeper than the depth of the position d1. The short-lifetime region 32 contains a lifetime killer formed by irradiating with light ions, such as He ions or protons (hereinafter referred to as He ions, etc.) and is a region in which a lifetime of carriers is shorter than lifetimes of carriers in the other regions.

The short-lifetime region 32 also includes the deepest sections of p-n junction surfaces 33 and 34 as junction interfaces of the p$^+$-diffusion regions 24 and 25 (guard rings regions), respectively, with the n$^-$-semiconductor layer 22. With the short-lifetime region 32 thus provided, current concentration into the end section of the chip is reduced at reverse recovery of the diode, by which a high di/dt capability can be obtained.

Here, the depth of the p$^+$-diffusion region 23, namely the deepest position d1 of the p-n junction surface 31 formed from the n$^-$-semiconductor layer 22 and the p$^+$-diffusion region 23, is preferably within the range between 12.6 μm and 22 μm from the surface of the p$^+$-diffusion region 23. Although the design value of the depth of the position d1 from the surface of the p$^+$-diffusion region 23 is between 14 μm and 20 μm, with a crystallization tolerance of ±10% allowed, the depth of the position d1 can have the above value in an actually completed diode.

In manufacturing the diode having the structure shown in FIG. 1, the p$^+$-diffusion regions 23, 24, and 25 are first selectively formed in the surface layer of the n$^-$-semiconductor layer 22. At this time, there is no need to locally deepen only the end sections of the p$^+$-diffusion regions 24 and 25 to form the guard ring regions and only the end section of the p$^+$-diffusion region 23 need to be an anode region. Namely, the p$^+$-diffusion regions 23, 24, and 25 can be formed at the same time by a single diffusion process. Therefore, there is no increase in chip costs.

Then, the entire surfaces of the p$^+$-diffusion regions 23, 24, and 25, and the n$^-$-semiconductor layer 22 are irradiated with He ions, etc., to introduce the He ions etc., into a crystal. After this, annealing is carried out at a temperature of the order of 350° C. In this way, the lifetime killer is introduced to form the short-lifetime region 32.

In the above process, at the irradiation with the He ions, etc., the irradiation is carried out so that the depth of the p$^+$-diffusion region 23, that is, the depth of the position d1, becomes equal to or more than the irradiation half width with the He ions, etc. Moreover, the irradiation is carried out so that the position of the peak of the He ions, etc., comes within the range between 80% and 120% of the depth of the position d1.

For light ions with which the chip is irradiated, He ions are effective. A specific example of an irradiation condition with He ions can be carried out with $^3$He$^{2+}$ under an accelerating voltage of 23 MeV. In this case, a short-lifetime region 32 is formed having a depth or thickness of the order of 5 μm on each of the upper and lower sides of the position d1. This can make carriers effectively disappear at reverse recovery.

As an example, specifications such as dimensions of the PIN diode according to the embodiment are as follows. With a module rating voltage of 1200V and a breakdown voltage of 1600V, the thickness of the n$^-$-semiconductor layer 22, made of an FZ wafer having specific resistance of 120 Ωcm, is about 300 μm. Moreover, the p$^+$-diffusion layer 23 is formed to a depth of 22±2 μm, including crystallization tolerance, with a dose of 1×10$^{15}$ cm$^{-2}$.

Figure 2:
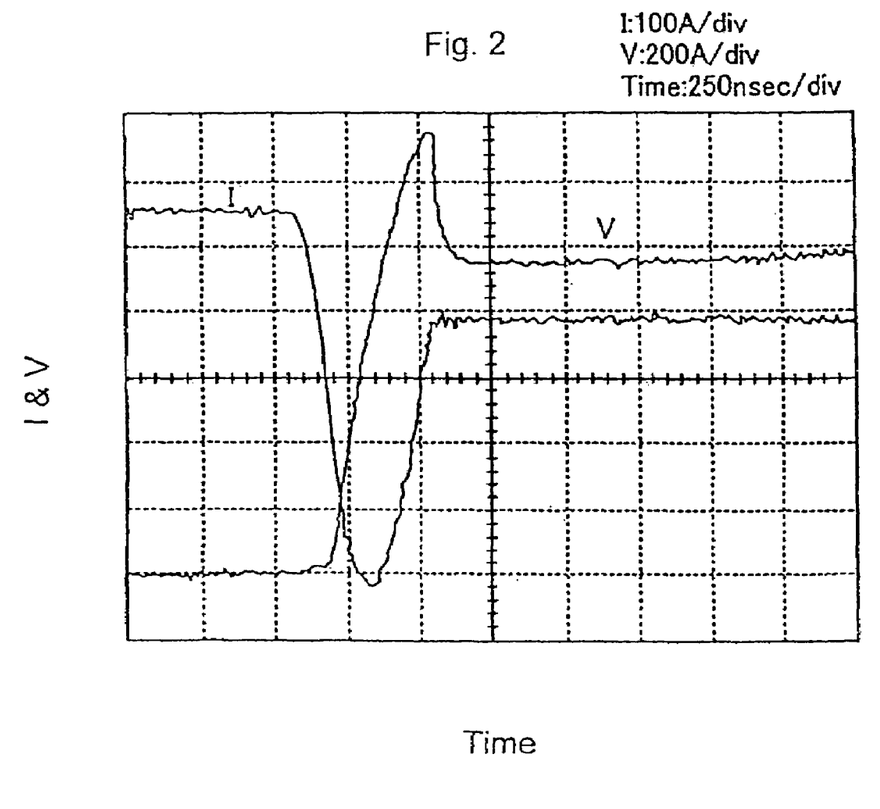
FIG. 2 is a waveform diagram showing surge waveforms of a current and a voltage in the PIN diode according to the embodiment.

Next, explanations will be made regarding the results of the examination carried out by the inventors about the characteristics of the PIN diode according to the embodiment. FIG. 2 is a waveform diagram showing results of the examination of the surge waveforms of a current I and a voltage V. In the waveform diagram in FIG. 2, the vertical axis represents the current I and the voltage V, and the horizontal axis represents a time with one scale division on the axis taken as 100 A for the current 1, 200V for the voltage V, and 250 nsec for the time. FIG. 2 illustrates that the diode is not damaged although di/dt is as high as 4000 A/sec.

Figure 3:
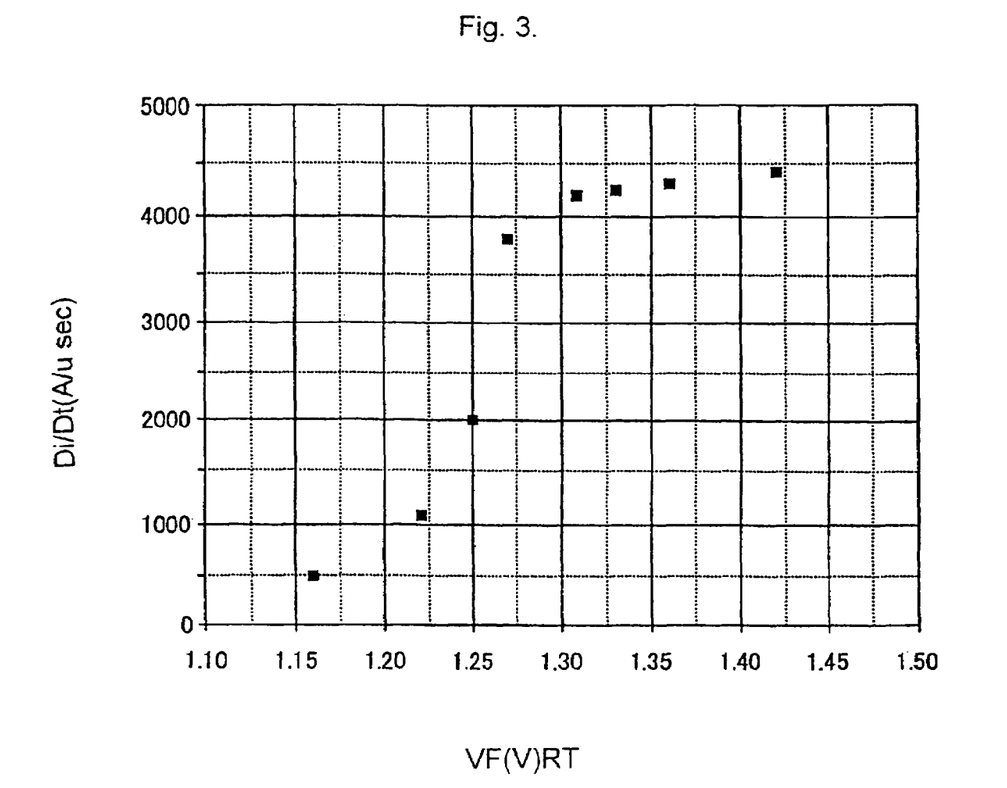
FIG. 3 is a characteristic diagram showing a relationship between a di/dt capability and a forward voltage VF of the PIN diode according to the embodiment.

FIG. 3 is a characteristic diagram showing the relationship between a di/dt capability and the forward voltage VF. As shown in FIG. 3, the di/dt capability exceeding 4000 A/μsec is ensured while keeping an increase in the forward voltage VF to a minimum. In the PIN diode as the example shown in FIG. 3, annealing is carried out at a temperature of the order of 350° C. after carrying out irradiation with He ions, by which both of a low forward voltage VF and a high di/dt capability against a surge are achieved.

Figure 4:
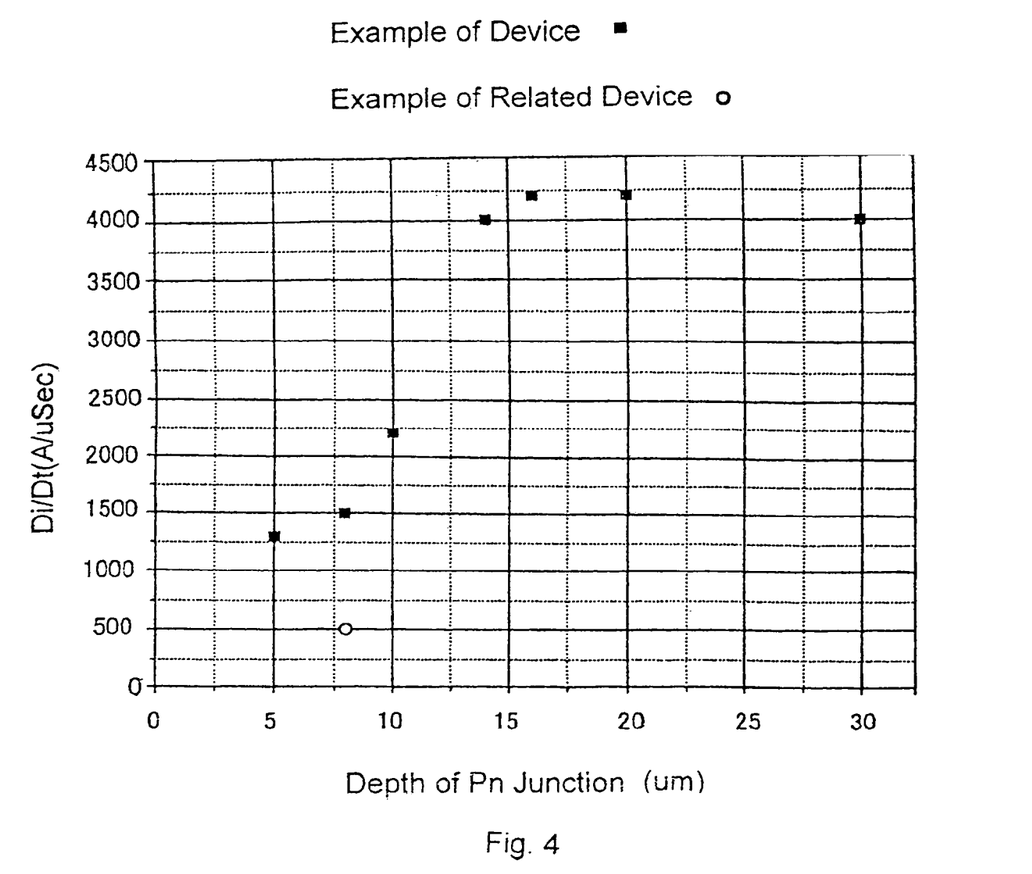
FIG. 4 is a characteristic diagram showing a relationship between the di/dt capability and the depth of the p-n junction of the PIN diode according to the embodiment.

FIG. 4 is a characteristic diagram showing the relationship between the di/dt capability and the depth of the p-n junction (the position d1), that is, the depth of the p$^+$-diffusion layer 23. As shown in FIG. 4, it is known that, by providing the p-n junction at a depth of 14 μm or more, the short-lifetime region 32 is formed in the interior of the semiconductor crystal to allow a high di/dt capability of 4000 A/μsec or more to be obtained. In FIG. 4, a plot with a white circle is for a related PIN diode having the p-n junction at a depth of 8 μm.

Figure 5:
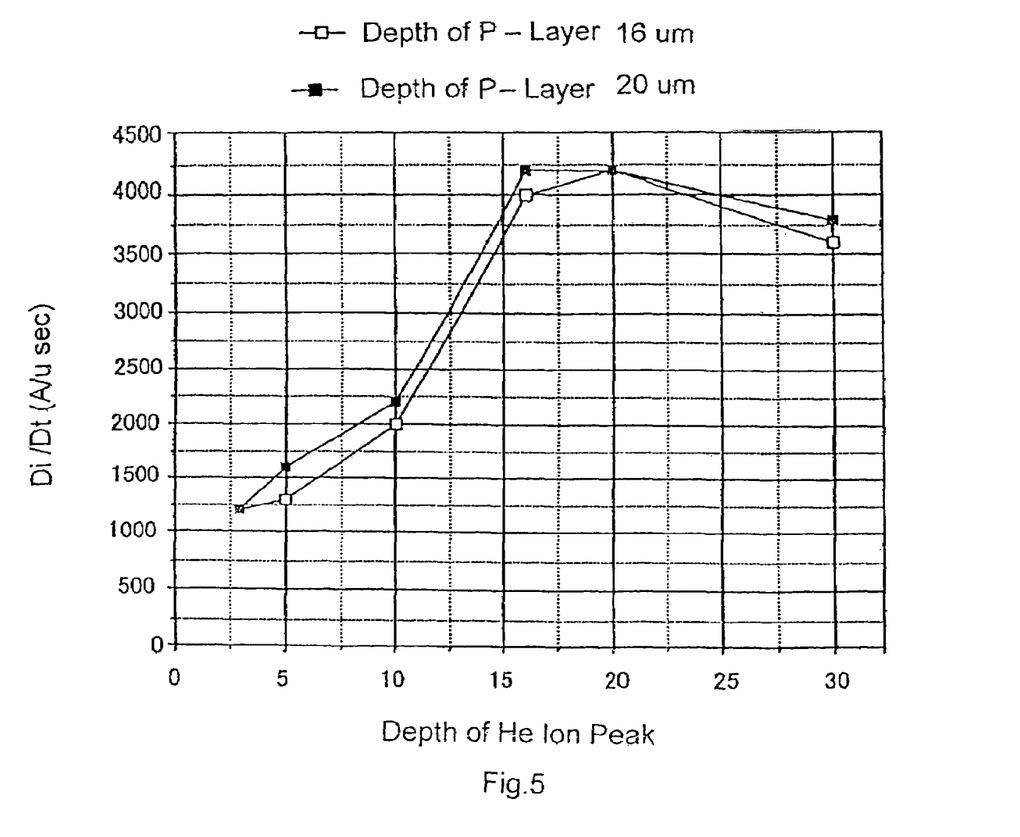
FIG. 5 is a characteristic diagram showing a relationship between the di/dt capability and the position of the peak of the He ions.

FIG. 5 is a characteristic diagram showing a relationship between the di/dt capability and the position of the peak of the He ions, that is, the depth of the short-lifetime region 32, when the depth of the p-n junction (the position d1) is taken as 16 μm or 20 μm. As shown in FIG. 5, with the short-lifetime region 32 including the p-n junction surface 31 and with the position of the peak of the He ions being within ±20% of the depth of the p-n junction, a typical value of the capability of each diode is equal. Moreover, the forward voltage VF can be kept to a minimum.

As explained above, the short-lifetime region 32 is provided over the entire surface of the chip in a region ranging from the position (d2) shallower than the p-n junction surface 31 at a depth (the position d1) of 14 to 20 μm (design value) to the position (d3) deeper than the junction surface. Therefore, carriers remaining without having completely disappeared at the end section of the chip can be made to effectively disappear. Thus, without a considerable increase in the forward voltage VF, a diode can be obtained having a sufficiently high di/dt capability against a surge such as a lightening surge.

The present invention is not limited to the above-explained embodiment but can be variously modified. For example, the above-described dimensions and doses are mere examples and the present invention should not be limited to them. Moreover, in the above-described embodiments, the first conductivity type is taken as an n-type and the second conductivity type is taken as a p-type. The invention, however, is similarly valid even when the first conductivity type is taken as a p-type and the second conductivity type is taken as an n-type.

As explained in the foregoing, the semiconductor device and the method of manufacturing the device according to the invention are useful for a semiconductor device mounted on a module such as a power module. In particular, the device and the method are suited for a PIN diode used for a converter and a free wheeling diode used for an inverter.

A semiconductor device and a method of manufacturing according to the present invention can achieve a di/dt capable of being sufficiently high to such an extent that the device can withstand a lightening surge and has a low forward voltage VF.

Given the disclosure of the present invention, one versed in the art would appreciate that there may be other embodiments and modifications within the scope and spirit of the present invention. Accordingly, all modifications and equivalents attainable by one versed in the art from the present disclosure within the scope and spirit of the present invention are to be included as further embodiments of the present invention. The scope of the present invention accordingly is to be defined as set forth in the appended claims.

This application is based on, and claims priority to, Japanese Application No. 2004-158223, filed on May 27, 2004, and the disclosure of the priority application, in its entirety, including the drawings, claims, and the specification thereof, is incorporated herein by reference.

What is claimed is:

1. A semiconductor device comprising:
a semiconductor layer of a first conductivity type;
a diffusion region of a second conductivity type semiconductor region selectively formed in a surface layer of the first conductivity type semiconductor layer; and
a short-lifetime region with a lifetime of carriers made shorter than lifetimes of carriers in other regions,
wherein the diffusion region has a depth of 12.6 µm or greater,
wherein the short-lifetime region includes a lifetime killer, formed by irradiation with light ions, over the entire semiconductor layer and the diffusion region from a position shallower than the deepest position of a p-n junction surface, as a junction interface between the diffusion region and the semiconductor layer, to a position deeper than the deepest position of the p-n junction surface.

2. The semiconductor device according to claim 1, wherein the light ions are He ions.

3. The semiconductor device according to claim 2, wherein the depth of the diffusion region is 14 µm or greater.

4. The semiconductor device according to claim 3, wherein the depth of the diffusion region is equal to or less than 22 µm.

5. The semiconductor device according to claim 1, further including at least one guard ring region provided around an active region, wherein the diffusion region includes the guard ring region.

6. The semiconductor device according to claim 3, further including at least one guard ring region provided around an active region, wherein the diffusion region includes the guard ring region.

7. The semiconductor device according to claim 4, further including at least one guard ring region provided around an active region, wherein the diffusion region includes the guard ring region.

8. The semiconductor device according to claim 1, wherein the semiconductor device is a PIN diode.

9. The semiconductor device according to claim 5, wherein the semiconductor device is a PIN diode.

10. The semiconductor device according to claim 6, wherein the semiconductor device is a PIN diode.

11. The semiconductor device according to claim 7, wherein the semiconductor device is a PIN diode.

12. A method of manufacturing a semiconductor device having a semiconductor region of a first conductivity type and a diffusion region of a second conductivity type in the semiconductor region, and a short-lifetime region with a lifetime of carriers made shorter than lifetimes of carriers in other regions, wherein the diffusion region has a depth of 12.6 µm or greater, and wherein the short-lifetime region includes a lifetime killer, the method comprising the steps of:
selectively forming the diffusion region of the second conductivity type on the semiconductor layer so that the depth of the diffusion region becomes 14 µm or greater; and
forming the short-lifetime region, with the lifetime of carriers made shorter than lifetimes of carriers in other regions,
wherein the lifetime killer is formed by irradiating with light ions over the entire surfaces of the semiconductor layer and the diffusion region, from a position shallower than the deepest position of a p-n junction surface, as a junction interface between the diffusion region and the semiconductor layer, to a position deeper than the deepest position of the p-n junction surface.

13. The method of manufacturing a semiconductor device according to claim 12, wherein the light ions are He ions, which are irradiated over the entire surfaces of the semiconductor layer and the diffusion region so that a position of a peak of the He ions becomes deeper than a half width of the He ion irradiation.

14. The method of manufacturing a semiconductor device according to claim 13, wherein the He ion irradiation is carried out so that the position of the peak of the He ions comes within the range between 80% and 120% of the depth of the diffusion region.

15. The method of manufacturing a semiconductor device according to claim 13, wherein $^3He^{2+}$ is used as a He ion species.

16. The method of manufacturing a semiconductor device according to claim 12, wherein the semiconductor device is a PIN diode.

17. The method of manufacturing a semiconductor device according to claim 12, wherein the diffusion region includes at least one guard ring region provided around an active region.

18. A semiconductor made by the method of claim 13.

* * * * *